United States Patent [19]

Hoffman

[11] 4,245,165

[45] Jan. 13, 1981

[54] REVERSIBLE ELECTRICALLY VARIABLE ACTIVE PARAMETER TRIMMING APPARATUS UTILIZING FLOATING GATE AS CONTROL

[75] Inventor: Charles R. Hoffman, Raleigh, N.C.

[73] Assignee: International Business Machines Corporation, Armonk, N.Y.

[21] Appl. No.: 964,323

[22] Filed: Nov. 29, 1978

[51] Int. Cl.$^3$ .................... H03K 5/00; H03K 17/60; H03K 3/26
[52] U.S. Cl. ........................... 307/238; 307/237; 307/251; 307/296 R; 307/303; 357/54
[58] Field of Search ............... 307/200 A, 251, 238, 307/237, 279, 303, 304, 358, 296; 357/54

[56] References Cited

U.S. PATENT DOCUMENTS

| | | | |
|---|---|---|---|
| 3,275,911 | 9/1966 | Onodera | 307/303 |
| 3,436,623 | 4/1969 | Beer | 357/54 |
| 3,721,838 | 3/1973 | Brickman et al. | 307/303 |
| 3,795,974 | 3/1974 | Calhoun | 357/54 |
| 3,836,992 | 9/1974 | Abbas et al. | 357/54 |

OTHER PUBLICATIONS

IBM Tech. Dsclre. Bttn., Fusible Link Device, L. Ewald et al., vol. 19, No. 8, Jan. 77, pp. 3089–3090.

*Primary Examiner*—Stanley D. Miller, Jr.
*Assistant Examiner*—B. P. Davis
*Attorney, Agent, or Firm*—Edward H. Duffield

[57] ABSTRACT

A continuously variable, reversible active circuit parameter trimming or adjustment method and apparatus are described. An active field effect transistor having a control gate to which a voltage is applied for the purpose of varying the conduction in the FET is achieved by supplying the control gate voltage from the stored voltage on a floating gate FET which has been charged to the desired variable level for controlling the conduction in the controlled FET at the desired operating point for parameter adjustment in an active circuit of which the FET may form a part. The floating gate FET structure can be electrically adjusted by charging or discharging the floating gate thereof which acts as a fixed memory to supply the appropriate control voltage to the controlled FET electrically connected thereto by a conductor connecting the control gate of the FET with the floating gate in the trimming or parameter adjustment floating gate FET element.

3 Claims, 5 Drawing Figures

REVERSIBLE ELECTRICALLY VARIABLE ACTIVE PARAMETER TRIMMING APPARATUS UTILIZING FLOATING GATE AS CONTROL

TECHNICAL FIELD

This invention relates to electrically alterable or programmable solid state memory devices and field effect transistors in general and to circuit parameter trimming or adjustment methods and apparatus in particular employed in large scale integrated circuit manufacturing operations.

PRIOR ART

A typical problem encountered in integrated circuit manufacture and design of numerous elements connected on a semiconductive substrate chip is that of matching voltage levels among the various elements integrated on the chip. Many problems such as operational amplifier offset voltage levels, linearity of digital to analog converter circuits, variable threshold levels in switches and triggering circuits and the like result from the fact that as the individual circuit elements are created on the chip, minute variations in size, conductivity, etc., will create numerous slightly differing voltage operating points in the devices. Trimming techniques, as they are called, are widely employed in the industry to adjust the operating voltages of the various elements on the chip to improve the overall circuit performance. Variable resistors which may be laser etched, or chemically etched, fusible metal links that may be cut by the use of laser etc., an array of zener diodes which may be selectively shorted or connected, etc., are all trimming operations currently employed. The varying of an active resistor area that is employed, an active capacitance that can be reduced by etching away of a capacitive plate, etc., are similar techniques.

Examples of these trimming techniques may be found in Price, J. J. et al, "A Precision Slope Polarity Switch for a Monolithic Telephone Quality Delta Modulator" ISSCC Digest of Technical Papers, 1977, page 6061. Similarly, Fredericksen et al, "A Single Chip, All Bipolar, Camera Control I. C." ISSCC Digest of Technical Papers, 1977, page 214-215. Or see Comer, D. T., "A Monolithic Twelve Bit D/A Converter", ISSCC Digest of Technical Papers, 1977, page 104 and 105.

A difficulty with the prior art trimming techniques as employed in integrated circuit technology is that they are not reversible in the ordinary sense. Once the active link has been broken, such as in shorting of zener diode leads, the removal of resistive material or similar operations, the parameter controlled by the variation in this element cannot be modified in the reverse direction. Furthermore, the parameter being adjusted by a laser etching or link fusing technique must be carefully monitored during the adjustment phase so that accuracy in the final trimming is obtained. This is an expensive and time consuming operation, especially when conducted on a minute scale of integrated circuit chip.

OBJECTS

In view of the foregoing difficulties in the prior art, it is an object of the present invention to provide an improved trimming apparatus and method which is electrically variable and reversible.

SUMMARY

The foregoing and still other objects not enumerated for the present invention are met by creating on the integrated circuit chip at least one floating gate field effect transistor device having the floating gate thereof connected to the control gate of at least one other field effect transistor device having its control gate operated at the voltage to which the floating gate of the floating gate field effect device is charged. Charging or discharging of the floating gate element on the floating gate transistor device is accomplished by applying appropriate voltages to the control gate of that device and to the source and drains thereof as is well known in the art. The resulting charge or voltage which appears on the floating gate of the device may be viewed as electrically permanent until its state of charge is electrically altered by applying new voltages to the source, drain and control gate thereof at will. Thus, the voltage appearing on the floating element in the floating gate FET is permanent in time and may be charged or discharged to the desired level and then left alone. An electrical conductor connects the voltage on the floating gate element thus created to the control gate electrode of an active FET to vary the state of conduction in that FET as is normally a mode of operation for such devices. The active FET may form a part of an analog or digital circuit in which the parameter of current or voltage is to be varied by varying the state of conduction of the FET itself. This is accomplished by varying the voltage on the control gate electrode and this, in turn, is variably supplied by the retained voltage on the floating gate element in the floating gate FET.

BRIEF DESCRIPTION OF DRAWINGS

Preferred embodiments of the invention will now be described with reference to the drawings in which.

DETAILED DESCRIPTION

Figure 1:
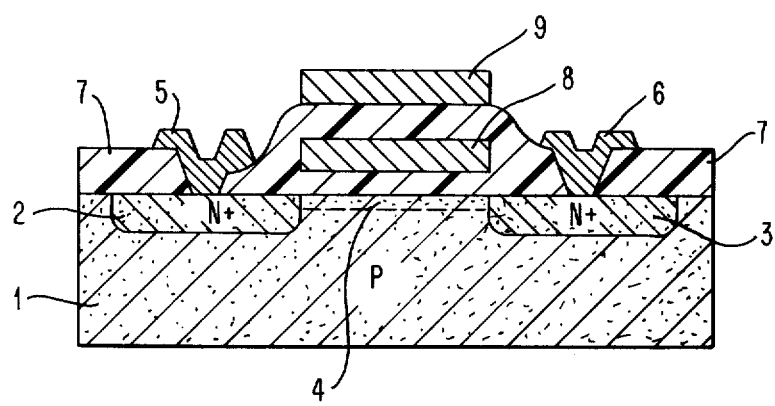
FIG. 1 illustrates a schematic cross-section of a typical floating gate field effect transistor suitable for use in the present invention.

Turning to FIG. 1, a longitudinal cross-section of an N-channel floating gate field effect transistor is illustrated. Since the structure of such floating gate effect transistors is well known in the art, only a brief description of the generic type illustrated in FIG. 1 will be given. A semiconductive substrate 1, in this case P type silicon, is provided with N-doped source and drain regions 2 and 3, respectively. A conductive channel region 4 connects source 2 with drain 3 and may be created either by doping or by depletion by the application of a control voltage on a gate as is well known. A source metal contact to the source diffusion is illustrated as source contact 5. A drain contact 6 similarly makes contact with the drain diffusion 3. An overlying silicon dioxide insulator layer 7 through which contacts 5 and 6 extend is also shown. A floating gate of conductive polysilicon is illustrated as floating gate 8 which is completely surrounded on all sides by the insulator layers 7. A control gate 9 of polysilicon or metal overlies the floating gate and is separated therefrom by the insulator layer 7. Construction and operation of such devices are quite well known and are shown for example in U.S. Pat. No. 3,955,098 where the floating gate structure is charged to the desired potential to create a high level of conduction in its transistor channel, specifically the gate voltages being higher than the power supply voltage to which the semiconductors are connected, thereby driving these transistors into saturation conduction. But this patent does not suggest the use of the floating gate device for setting the operative level on a control gate within the range of voltage applied by the power supply to the active transistor having the control gate for the purpose of trimming or adjusting the operative current level through the active FET as described herein. The application of a stored floating gate potential to the control gate of an active FET in a circuit whose conductive parameters are to be trimmed or adjusted is nowhere suggested in the aforementioned patent since its teaching is solely that of establishing a saturated bias condition for promoting large voltage swings in a switching circuit, not for adjusting and maintaining a precise match of voltage or current as is required in a trimming operation performed within the limits of the ordinary supply voltage applied to the circuit to be trimmed. Apparatus as shown in this patent can be applied in the present invention by making the controlled FET a part of the active circuit whose parameters are to be trimmed and by utilizing programming voltages on the floating gate device which can be varied until the output parameters of the controlled device are optimized. Then the voltages on the programming floating gate FET can be removed and the floating gate will remain charged to the desired optimized bias potential for operating the trimming FET at the optimum point. This is a radical departure from the normally used trimming methods and apparatus since no variable resistors or capacitors are required nor are they necessary to be connected to control the state of an active element, no specialized laser etching or burn or fusing techniques are necessary and no precision screening of resistive material is employed. Similarly, no "real estate" on the LSI chip beyond the minimum amount necessary for two small transistors is required so the density of active circuits can be increased.

Figure 2:
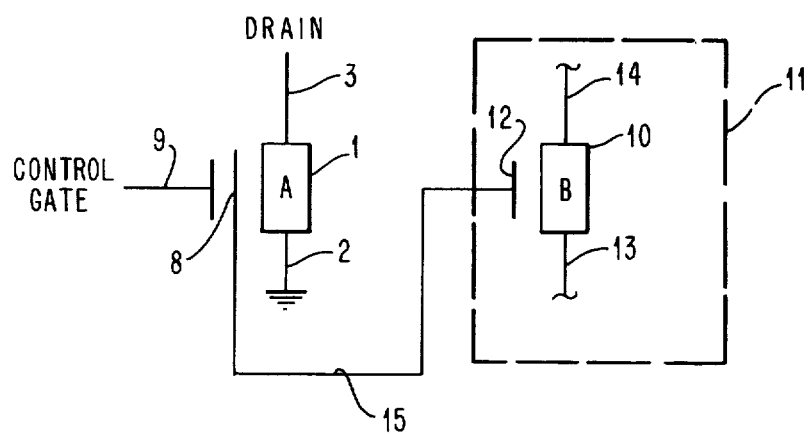
FIG. 2 illustrates an electrical schematic diagram for the connection of a floating gate element field effect transistor to a control gate of an active FET whose state of conduction is to be electrically trimmed.

Turning then to FIG. 2, a schematic diagram of a functional circuit utilizing the trimming apparatus and technique of the present invention is shown. In FIG. 2, the second polysilicon layer 9 on the floating gate FET 1 having source and drain 2 and 3 respectively is used as the control gate for floating gate FET 1. To this control gate 9 would be applied the programming voltages which may be somewhat higher than those ordinarily utilized to charge the floating gate 8 to various levels. These levels are transferred via conductor 15 which may be an extension of the first polysilicon layer forming gate 8 to the control gate 12 of active transistor 10 having source 13 and drain 14 and being a part of functional circuit 11 whose parameters are to be trimmed or adjusted. By appropriate manipulation of the drain and gate voltage on transistor 1, the charge on floating gate 8 can be set at the desired bias point for transistor 10, after which the voltages for transistor 1 can be removed and the floating gate 8 will remain at the charged potential.

Applications for such a trimming apparatus and method are many. But examples might be a programmable voltage reference source in which the active FET 10 forms a portion of an operational amplifier and the floating gate 8 input to it is maintained at a reference level programmed in the floating gate FET. Similarly, it may be utilized as a threshold detector where the level on the floating gate FET programs a detector threshold reference level for comparison against the input voltage to the active circuit 11 in FIG. 2. Oscillator frequency trimming, and all of the various types of trimming operations suggested in the aforementioned articles by Price et al, Fredericksen et al and Comer can be met with this invention.

In order for the present invention to be constructed, a process technology that can make floating gate devices and regular FET circuits on the same chip is preferred. Several processes or variations of them that can achieve this are well known in the art. For example, see Mueller et al, IEEE Journal of Solid State Circuits, Volume SC-12, No. 5, Oct. 1977, pages 507-514, or Rodgers et al, IEEE Journal of Solid State Circuits, Volume SC-12, No. 5, Oct. 1977, pages 515-523 or Barnes et al, in Solid State Electronic, 1978, Vol. 21, pages 521-529, where various process technologies and device structures which can easily be utilized in the present invention are taught.

The first cited reference and the latter describe planar structures while the second reference gives a different VMOS structure. Therefore, there is no unique process involved in constructing the present invention, many equally suitable ones being well known in the art as described in the aforementioned references.

Figure 3:
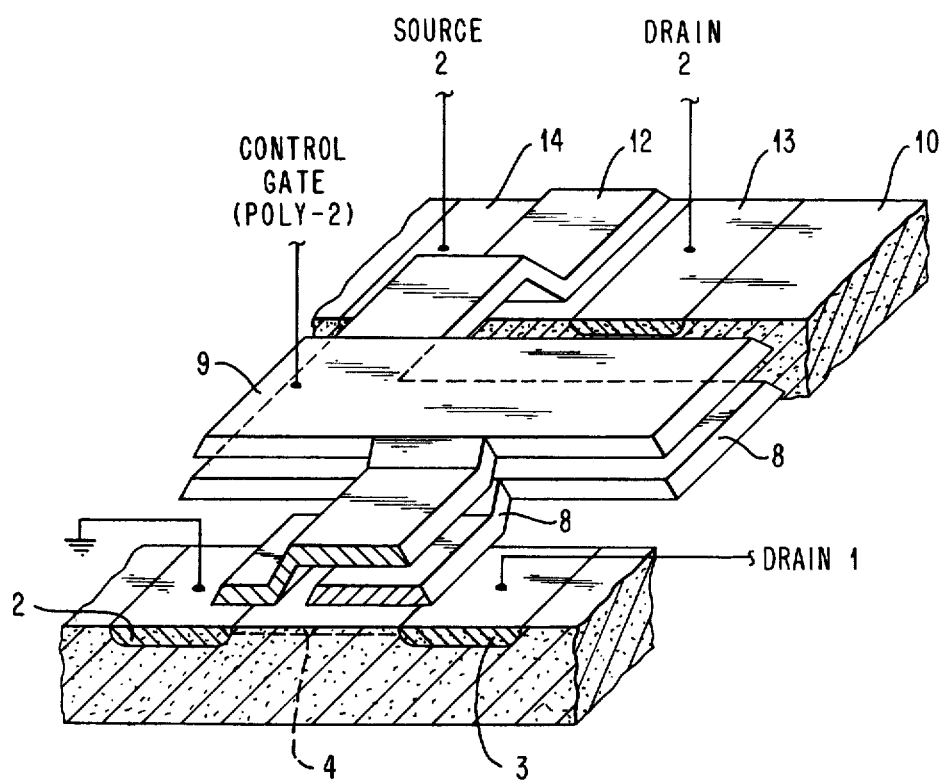
FIG. 3 is a simplified pictorial view of the floating gate field effect device and a separate active field effect device whose state of conduction is to be varied together with the interconnecting conductors which connect the stored charge on the floating gate of the floating gate device to the control gate in the active FET device.

As utilized in the present invention, however, the floating gate 8 may be extended to act as the gate of a regular FET. FIG. 3 pictorially illustrates such an example. However, one of the key considerations in constructing the present invention utilizing floating gate technology is the coupling from the control gate 9 to the floating gate 8. As is evident from FIG. 3, the polysilicon layers 8 and 9 forming the floating and control gates, respectively, can be thought of as the plates of capacitors with the oxide layers (not shown in FIG. 3 for clarity) between them being the dielectric material. The schematic circuit model for such a structure is shown in FIG. 4.

Figure 4:
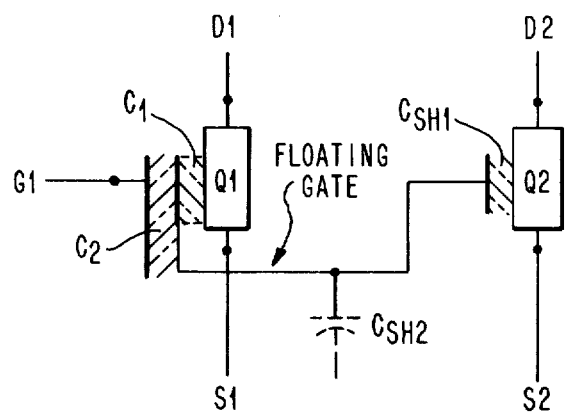
FIG. 4 is an electrical schematic diagram similar to FIG. 2 but showing the effects of the various capacitances created between the various gates, the separating insulators and the substrates in the two field effect devices and including the effect of shunt capacitance between the connector and the substrate.

In FIG. 4 it will be observed that several capacitances are formed between the various polysilicon gate areas and underlying gates or substrate materials. Capacitor $C_1$ is that formed between the floating gate 8 and the channel in the floating gate FET. Capacitance $C_2$ is that capacitance between the control gate 9 and the floating gate 8. There are also some shunt capacitances which tend to affect the capacitances $C_1$ and $C_2$ which are as follows. Shunt capacitance $C_{SH1}$ equals the area under the gate that covers the channel of the controlled FET. Capacitance $C_{SH2}$ is that formed under the floating gate material that is not over either of the transistors but in the area extending between them as shown in FIG. 3 for example.

It is generally known that the capacitance formed between the control gate 9 and the floating gate 8 should be large in comparison to the capacitance formed between the floating gate and the channel as was pointed out in the Rodgers article identified above and in the Mueller et al reference identified above. When the floating gate material is extended from the floating gate FET to form the control gate of the ordinary FET the effects of the additional capacitance formed by the extension as shown in FIG. 4 must be considered. In order to compensate for the shunt capacitance that is added by the floating gate extension, the area of the capacitor formed by the polysilicon layer 1 and polysilicon layer 2 must be increased proportionately. This is shown in FIG. 3 where the expanded areas of a polysilicon control gate 9 and the polysilicon gate 8 overlap one another in the region between the two transistor channels.

Figure 5:
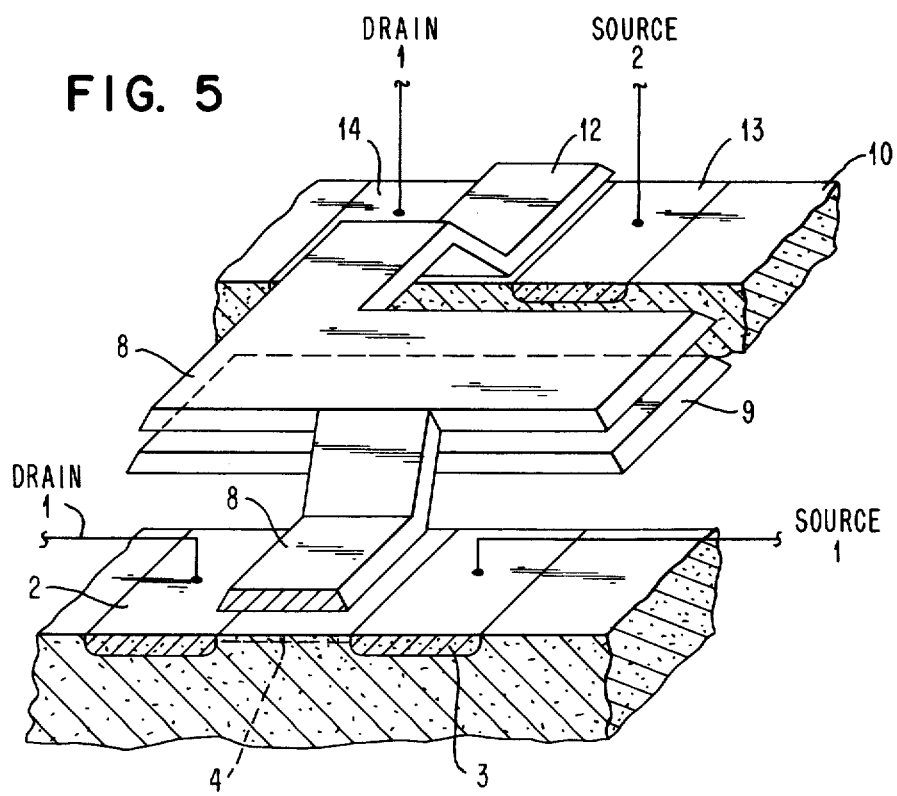
FIG. 5 is the pictorial diagram of an alternative embodiment.

The shunt capacitance as illustrated in FIG. 4 can be minimized by using the polysilicon layer 9 as a floating gate as illustrated in FIG. 5. Since the control gate 9 is physically below the floating gate 8 in FIG. 5, the shunt component $C_{SH2}$ appearing in the total shunt capacitance is effectively eliminated. This structure allows a smaller area of semiconductor real estate to be used while still achieving a given coupling factor from the control gate to the floating gate as is desired.

As an example now, consideration will return to the embodiment of the invention as illustrated in FIG. 3.

As will now be apparent to those of skill in the art, the present invention can be embodied using a variety of materials and processes generally available and known in the art and a structure that is amenable to high density fabrication on the same chip with a plurality of other FET circuits is achieved. Electronic trimming or balancing of the various circuit parameters utilizing the apparatus and technique of the present invention may be quickly had via external pin connections of the type normally employed in packaging electronic chips of this type. This is a very great advantage, since it avoids the high precision laser etching or other material removal techniques, shorting of diodes or cutting of electrical connections as is ordinarily employed in the trimming operations in the present state of the art.

Having thus described my invention, what I claim as new, and desire to secure by Letters Patent is:

1. A reversible, electrically variable active conduction parameter trimming apparatus, comprising:
   a floating gate first FET device having a source, drain, first floating gate and second control gate, respectively;
   a second FET device having a source, drain, and a control gate, said second FET device being connected in a circuit whose conduction parameter is to be trimmed or adjusted; and
   an electrically conductive means connecting said first gate of said first FET to said control gate of said second FET, thereby applying the voltage level of said floating gate to said control gate and providing a means for adjustable control of the level of current conduction in said second FET and the circuit in which it is connected.

2. Apparatus as described in claim 1, wherein:
   said electrically conductive means connecting said gates is an extension of said floating gate material and is integral therewith.

3. Apparatus as described in claim 1 or claim 2, wherein:
   said electrically conductive means connecting said gates includes a capacitance formed between said control gate and said floating gate of said first FET device, said capacitance being greater in magnitude than the capacitance between said control gate and the substrate of said first FET.

* * * * *